United States Patent
Setlur et al.

(10) Patent No.: US 7,442,326 B2
(45) Date of Patent: *Oct. 28, 2008

(54) RED GARNET PHOSPHORS FOR USE IN LEDS

(75) Inventors: Anant Achyut Setlur, Niskayuna, NY (US); Alok Mani Srivastava, Niskayuna, NY (US); Holly Ann Comanzo, Niskayuna, NY (US); Yan Gao, Niskayuna, NY (US); Emil Vergilov Radkov, Euclid, OH (US)

(73) Assignee: Lumination LLC, Valley View, OH (US)

( * ) Notice: Subject to any disclaimer, the term of this patent is extended or adjusted under 35 U.S.C. 154(b) by 354 days.

This patent is subject to a terminal disclaimer.

(21) Appl. No.: 11/285,685

(22) Filed: Nov. 23, 2005

(65) Prior Publication Data

US 2006/0284196 A1 Dec. 21, 2006

Related U.S. Application Data

(63) Continuation-in-part of application No. 10/696,637, filed on Oct. 29, 2003, now Pat. No. 7,094,362.

(51) Int. Cl.
| | |
|---|---|
| *H01J 1/63* | (2006.01) |
| *H01L 51/00* | (2006.01) |
| *H01L 33/00* | (2006.01) |
| *H01L 27/15* | (2006.01) |
| *C09K 11/59* | (2006.01) |
| *C09K 11/66* | (2006.01) |
| *C09K 11/79* | (2006.01) |
| *C09K 11/78* | (2006.01) |
| *C09K 11/81* | (2006.01) |
| *C09K 11/84* | (2006.01) |
| *C09K 11/85* | (2006.01) |
| *C09K 11/86* | (2006.01) |

(52) U.S. Cl. .......... 252/301.4 F; 252/301.6 F; 252/301.4 P; 252/301.6 P; 252/301.4 S; 252/301.6 S; 257/98; 313/503; 313/485; 313/487

(58) Field of Classification Search ........ 313/503, 313/485, 487; 257/98; 252/301.4 R, 301.6 R, 252/301.4 F, 301.6 F, 301.4 P, 301.6 P, 301.4 H, 252/301.4 S, 301.6 S See application file for complete search history.

(56) References Cited

U.S. PATENT DOCUMENTS 4,550,256 A 10/1985 Berkstresser et al.

(Continued)

FOREIGN PATENT DOCUMENTS

DE 199 34 126 1/2001

(Continued)

OTHER PUBLICATIONS

Pinelli et al, "Study of the visible spectra of Ca2Sc2Ge3O12 garent crystals doped with Ce3+ or Pr3+", Aug. 23, 2003.*

(Continued)

*Primary Examiner*—C. Melissa Koslow
(74) *Attorney, Agent, or Firm*—Fay Sharpe LLP

(57) ABSTRACT

Phosphor compositions having the formula $L_lM_mA_aG_gP_pQ_qN_nZ_z:Ce^{3+}$, where L is at least one of Li, Na, K, Rb, and/or Cs; M is at least one of Be, Mg, Ca, Sr, Ba, Mn, Sn, Pb, and/or Zn; A is at least one of Bi, Sb, In, Sc, Y, and/or any of the rare earth elements; G is Si and/or Ge; Q is at least one of O, S, and/or Se; Z is at least one of F, Cl, Br, and/or I; and wherein $0 \leq l \leq 1$, $2.5 \leq m \leq 5$, $1.5 \leq a \leq 2.5$, $2 \leq g \leq 2.5$, $0 \leq p \leq 1$, $0 \leq n \leq 1$, $0 \leq z \leq 1$, and $l+2m+3a+4g+5p=2q+3n+z$; and light emitting devices including a light source and the above phosphor. Also disclosed are blends of $L_lM_mA_aG_gP_pQ_qN_nZ_z:Ce^{3+}$ and one or more additional phosphors and light emitting devices incorporating the same.

22 Claims, 2 Drawing Sheets

U.S. PATENT DOCUMENTS

| | | |
|---|---|---|
| 5,998,925 A | 12/1999 | Shimizu et al. |
| 6,069,440 A | 5/2000 | Shimizu et al. |
| 6,203,726 B1 | 3/2001 | Danielson et al. |
| 6,335,548 B1 | 1/2002 | Roberts et al. |
| 6,351,069 B1 | 2/2002 | Lowery et al. |
| 6,409,938 B1 | 6/2002 | Comanzo |
| 6,504,179 B1 | 1/2003 | Ellens et al. |
| 6,538,371 B1 | 3/2003 | Duggal |
| 6,552,487 B1 | 4/2003 | Ellens et al. |
| 6,596,195 B2 | 7/2003 | Srivastava et al. |
| 6,669,866 B1 | 12/2003 | Kummer et al. |
| 6,936,857 B2 | 8/2005 | Doxsee et al. |
| 7,094,362 B2 * | 8/2006 | Setlur et al. ............ 252/301.4 F |
| 2004/0188655 A1 | 9/2004 | Wu et al. |
| 2004/0251809 A1 | 12/2004 | Shimomura et al. |
| 2005/0156496 A1 | 7/2005 | Takashima et al. |

FOREIGN PATENT DOCUMENTS

| | | |
|---|---|---|
| EP | 1 095 998 A3 | 5/2002 |
| EP | 1 116 418 B1 | 10/2003 |
| JP | 2003-64358 | 3/2003 |
| WO | WO 00/18452 | 6/2000 |
| WO | WO 00/33390 | 6/2000 |
| WO | WO 01/93342 A1 | 12/2001 |
| WO | WO 02/099902 A1 | 12/2002 |
| WO | WO 03/102113 A1 | 12/2003 |
| WO | WO 2005/044947 | 5/2005 |
| WO | WO 2006/008935 A1 | 1/2006 |

OTHER PUBLICATIONS

Pinalli, et al., abstract for "Study of the visible spectra of Ca3Sc3Ge3O12 garent crystals doped with Ce3+ or Pr3+", Aug. 23, 2003, Optical Materials, vol. 25, Issue 1, pp. 91-99.

Cheng-Huang Kuo et al., "n-UV+Blue/Green/Red White Light Emitting Diode Lamps", Jpn. J. Appl. Phys., vol. 42 (2003) pp. 2284-2287, Part 1. No. 4B, Apr. 2003, The Japan Society of Applied Physics.

Young-Duk Huh, et al., "Optical Properties of Three-Band White Light Emitting Diodes" Journal of The Electrochemical Society, 150(2) H57-H60 (Jan. 2003).

* cited by examiner

RED GARNET PHOSPHORS FOR USE IN LEDS

The present application is a continuation-in-part and claims priority from U.S. patent application Ser. No. 10/696,637, filed on Oct. 29, 2003 now U.S. Pat. No. 7,094,362.

BACKGROUND

The present exemplary embodiments relate to novel phosphor compositions and phosphor blends. They find particular application in conjunction with converting LED-generated ultraviolet (UV), violet or blue radiation into white light or other colored light for general illumination purposes. It should be appreciated, however, that the invention is also applicable to the conversion of radiation in other applications, such as Hg-based fluorescent lamps, as scintillating detector elements in computed tomography (CT) and positron emission tomography (PET), UV, violet and/or blue lasers, as well as other white or colored light sources for different applications.

Light emitting diodes (LEDs) are semiconductor light emitters often used as a replacement for other light sources, such as incandescent lamps. They are particularly useful as display lights, warning lights and indicating lights or in other applications where colored light is desired. The color of light produced by an LED is dependent on the type of semiconductor material used in its manufacture.

Colored semiconductor light emitting devices, including light emitting diodes and lasers (both are generally referred to herein as LEDs), have been produced from Group III-V alloys such as gallium nitride (GaN). To form the LEDs, layers of the alloys are typically deposited epitaxially on a substrate, such as silicon carbide or sapphire, and may be doped with a variety of n and p type dopants to improve properties, such as light emission efficiency. With reference to the GaN-based LEDs, light is generally emitted in the UV and/or blue range of the electromagnetic spectrum. Until quite recently, LEDs have not been suitable for lighting uses where a bright white light is needed, due to the inherent color of the light produced by the LED.

Recently, techniques have been developed for converting the light emitted from LEDs to useful light for illumination purposes. In one technique, the LED is coated or covered with a phosphor layer. A phosphor is a luminescent material that absorbs radiation energy in a portion of the electromagnetic spectrum and emits energy in another portion of the electromagnetic spectrum. Phosphors of one important class are crystalline inorganic compounds of very high chemical purity and of controlled composition to which small quantities of other elements (called "activators") have been added to convert them into efficient fluorescent materials. With the right combination of activators and host inorganic compounds, the color of the emission can be controlled. Most useful and well-known phosphors emit radiation in the visible portion of the electromagnetic spectrum in response to excitation by electromagnetic radiation outside the visible range.

By interposing a phosphor excited by the radiation generated by the LED, light of a different wavelength, e.g., in the visible range of the spectrum, may be generated. Colored LEDs are often used in toys, indicator lights and other devices. Manufacturers are continuously looking for new colored phosphors for use in such LEDs to produce custom colors and higher luminosity.

In addition to colored LEDs, a combination of LED generated light and phosphor generated light may be used to produce white light. The most popular white LEDs are based on blue emitting GaInN chips. The blue emitting chips are coated with a phosphor that converts some of the blue radiation to a complementary color, e.g. a yellow-green color. The total of the light from the phosphor and the LED chip provides a color point with corresponding color coordinates (x and y) in the CIE 1931 chromaticity diagram and correlated color temperature (CCT), and its spectral distribution provides a color rendering capability, measured by the color rendering index (CRI).

One known white light emitting device comprises a blue light-emitting LED having a peak emission wavelength in the blue range (from about 440 nm to about 480 nm) combined with a phosphor, such as cerium doped yttrium aluminum garnet $Y_3Al_5O_{12}$: $Ce^{3+}$ ("YAG"). The phosphor absorbs a portion of the radiation emitted from the LED and converts the absorbed radiation to a yellow-green light. The remainder of the blue light emitted by the LED is transmitted through the phosphor and is mixed with the yellow light emitted by the phosphor. A viewer perceives the mixture of blue and yellow light as a white light.

Such systems can be used to make white light sources having correlated color temperatures (CCTs) of >4500 K and color rendering indices (CRIs) ranging from about 75-82. While this range is suitable for many applications, general illumination sources usually require higher CRIs and lower CCTs. One method of achieving this in devices utilizing blue emitting semiconductors requires that the phosphor emission be enhanced in the red spectral region compared to current yellow emission of conventional phosphors.

To accomplish this, phosphor blends utilizing deep red phosphors are sometimes used to produce light sources having a high general color rendering index (Ra). Two deep red phosphors currently being used in such applications are (Ca,Sr)S:$Eu^{2+}$ and $(Ba,Sr,Ca)_2Si_5N_8$:$Eu^{2+}$. While effective, such phosphors may reabsorb emission from other phosphors (e.g. TAG:Ce) that may be present in the illumination device due to the overlapping of the $Eu^{2+}$ absorption bands in these materials with the emission of the other phosphors. Thus, a need exists for a new phosphor having a redder emission than TAG:Ce phosphors for use in LEDs displaying high quantum efficiency to produce both colored and white-light LEDs having a high Ra.

BRIEF SUMMARY

In a first aspect, there is provided a phosphor composition $L_lM_mA_aG_gP_pQ_qN_nZ_z$:$Ce^{3+}$, where L is at least one of Li, Na, K, Rb, and/or Cs; M is at least one of Be, Mg, Ca, Sr, Ba, Mn, Sn, Pb, and/or Zn; A is at least one of Bi, Sb, In, Sc, Y, and/or any of the rare earth elements; G is Si and/or Ge; Q is at least one of O, S, and/or Se; Z is at least one of F, Cl, Br, and/or I; and wherein $0 \leq l \leq 1$, $2.5 \leq m \leq 5$, $1.5 \leq a \leq 2.5$, $2 \leq g \leq 2.5$, $0 \leq p \leq 1$, $0 \leq n \leq 1$, $0 \leq z \leq 1$, and $l+2m+3a+4g+5p=2q+3n+z$.

In a second aspect, there is provided a phosphor blend comprising a first phosphor $L_lM_mA_aG_gP_pQ_qN_nZ_z$:$Ce^{3+}$, where L is at least one of Li, Na, k, Rb, and/or Cs; M is at least one of Be, Mg, Ca, Sr, Ba, Mn, Sn, Pb, and/or Zn; A is at least one of Bi, Sb, In, Sc, Y, and/or any of the rare earth elements; G is Si and/or Ge; Q is at least one of O, S, and/or Se; Z is at least one of F, Cl, Br, and/or I; and wherein $0 \leq l \leq 1$, $2.5 \leq m \leq 5$, $1.5 \leq a \leq 2.5$, $2 \leq g \leq 2.5$, $0 \leq p \leq 1$, $0 \leq n \leq 1$, $0 \leq z \leq 1$, and $l+2m+3a+4g+5p=2q+3n+z$; and at least one additional phosphor.

In a third aspect, there is provided a white light emitting device including a light source emitting at from about 200 to about 500 nm and a phosphor composition $L_lM_mA_aG_gP_pQ_qN_nZ_z$:$Ce^{3+}$, where L is at least one of Li, Na, K, Rb, and/or Cs; M is at least one of Be, Mg, Ca, Sr, Ba, Mn, Sn, Pb, and/or Zn; A is at least one of Bi, Sb, In, Sc, Y, and/or any of the rare earth elements; G is Si and/or Ge; Q is at least one of O, S, and/or Se; Z is at least one of F, Cl, Br, and/or I; and wherein $0 \leq l \leq 1$, $2.5 \leq m \leq 5$, $1.5 \leq a \leq 2.5$, $2 \leq g \leq 2.5$, $0 \leq p \leq 1$, $0 \leq n \leq 1$, $0 \leq z \leq 1$, and $l+2m+3a+4g+5p=2q+3n+z$.

DETAILED DESCRIPTION

Phosphors convert radiation (energy) to visible light. Different combinations of phosphors provide different colored light emissions. The colored light that originates from the phosphors provides a color point. Novel phosphor compositions are presented herein as well as their use in LED and other light sources.

The color of the generated visible light is dependent on the particular components of the phosphor material. The phosphor material may include only a single phosphor composition or two or more phosphors of basic color, for example a particular mix with one or more of a yellow and red phosphor to emit a desired color (tint) of light. As used herein, the terms "phosphor" and "phosphor material" may be used to denote both a single phosphor composition as well as a blend of two or more phosphor compositions.

It was determined that an LED lamp that produces a white or colored light would be useful to impart desirable qualities to LEDs as light sources. Therefore, in one embodiment of the invention, a phosphor coated LED chip is disclosed for providing white or colored light. The visible light provided by the phosphor material (and LED chip if emitting visible light) comprises a bright white or colored light with high intensity and brightness.

Figure 1:
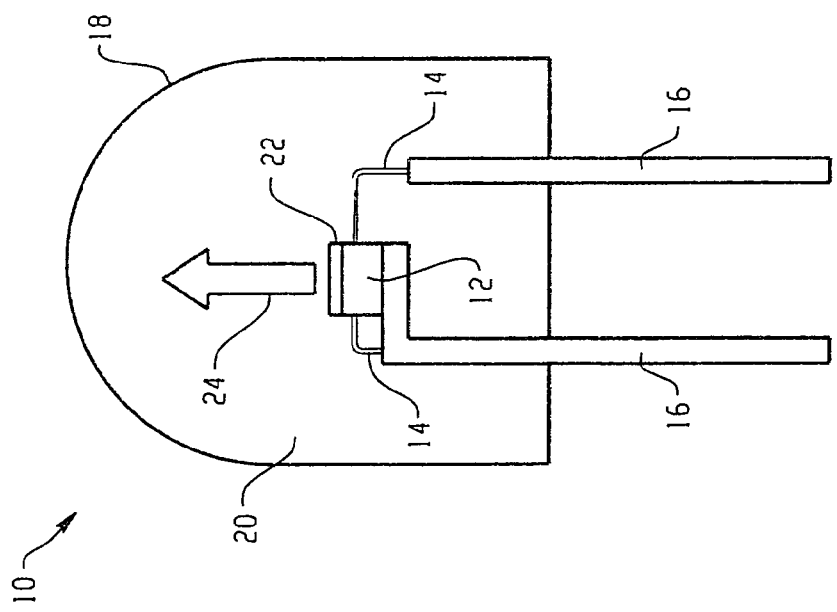
FIG. 1 is a schematic cross-sectional view of an illumination system in accordance with one embodiment of the present invention.

With reference to FIG. 1, an exemplary LED based light emitting assembly or lamp 10 is shown in accordance with one preferred structure of the present invention. The light emitting assembly 10 comprises a semiconductor UV or visible radiation source, such as a light emitting diode (LED) chip 12 and leads 14 electrically attached to the LED chip. The leads 14 may comprise thin wires supported by a thicker lead frame(s) 16 or the leads may comprise self supported electrodes and the lead frame may be omitted. The leads 14 provide current to the LED chip 12 and thus cause the LED chip 12 to emit radiation.

The lamp may include any semiconductor visible or UV light source that is capable of producing white light when its emitted radiation is directed onto the phosphor. The preferred peak emission of the LED chip in the present invention will depend on the identity of the phosphors in the disclosed embodiments and may range from, e.g., 200-500 nm. In one preferred embodiment, however, the emission of the LED will be in the near UV to deep blue region and have a peak wavelength in the range from about 350 to about 430 nm. Typically then, the semiconductor light source comprises an LED doped with various impurities. Thus, the LED may comprise a semiconductor diode based on any suitable III-V, II-VI or IV-IV semiconductor layers and having an emission wavelength of about 200 to 500 nm.

Preferably, the LED may contain at least one semiconductor layer comprising GaN, ZnO or SiC. For example, the LED may comprise a nitride compound semiconductor represented by the formula $In_iGa_jAl_kN$ (where $0 \leq i$; $0 \leq j$; $0 \leq k$ and $i+j+k=1$) having a peak emission wavelength greater than about 200 nm and less than about 500 nm. Such LED semiconductors are known in the art. The radiation source is described herein as an LED for convenience. However, as used herein, the term is meant to encompass all semiconductor radiation sources including, e.g., semiconductor laser diodes.

Although the general discussion of the exemplary structures of the invention discussed herein are directed toward inorganic LED based light sources, it should be understood that the LED chip may be replaced by an organic light emissive structure or other radiation source unless otherwise noted and that any reference to LED chip or semiconductor is merely representative of any appropriate radiation source.

The LED chip 12 may be encapsulated within a shell 18, which encloses the LED chip and an encapsulant material 20. The shell 18 may be, for example, glass or plastic. Preferably, the LED 12 is substantially centered in the encapsulant 20. The encapsulant 20 is preferably an epoxy, plastic, low temperature glass, polymer, thermoplastic, thermoset material, resin or other type of LED encapsulating material as is known in the art. Optionally, the encapsulant 20 is a spin-on glass or some other high index of refraction material. In one embodiment, the encapsulant material 20 is a polymer material, such as epoxy, silicone, or silicone epoxy, although other organic or inorganic encapsulants may be used. Both the shell 18 and the encapsulant 20 are preferably transparent or substantially optically transmissive with respect to the wavelength of light produced by the LED chip 12 and a phosphor material 22 (described below). In an alternate embodiment, the lamp 10 may only comprise an encapsulant material without an outer shell 18. The LED chip 12 may be supported, for example, by the lead frame 16, by the self supporting electrodes, the bottom of the shell 18, or by a pedestal (not shown) mounted to the shell or to the lead frame.

The structure of the illumination system includes a phosphor material 22 radiationally coupled to the LED chip 12. Radiationally coupled means that the elements are associated with each other so that at least part of the radiation emitted from one is transmitted to the other.

This phosphor material 22 is deposited on the LED 12 by any appropriate method. For example, a water-based suspension of the phosphor(s) can be formed, and applied as a phosphor layer to the LED surface. In one such method, a silicone, epoxy or other matrix material is used to create a slurry in which the phosphor particles are randomly suspended and placed around the LED. This method is merely exemplary of possible positions of the phosphor material 22 and LED 12. Thus, the phosphor material 22 may be coated over or directly on the light emitting surface of the LED chip 12 by coating and drying the phosphor suspension over the LED chip 12. Both the shell 18 and the encapsulant 20 should be transparent to allow light 24 to be transmitted through those elements. Although not intended to be limiting, in one embodiment, the median particle size of the phosphor material may be from about 1 to about 10 microns.

Figure 2:
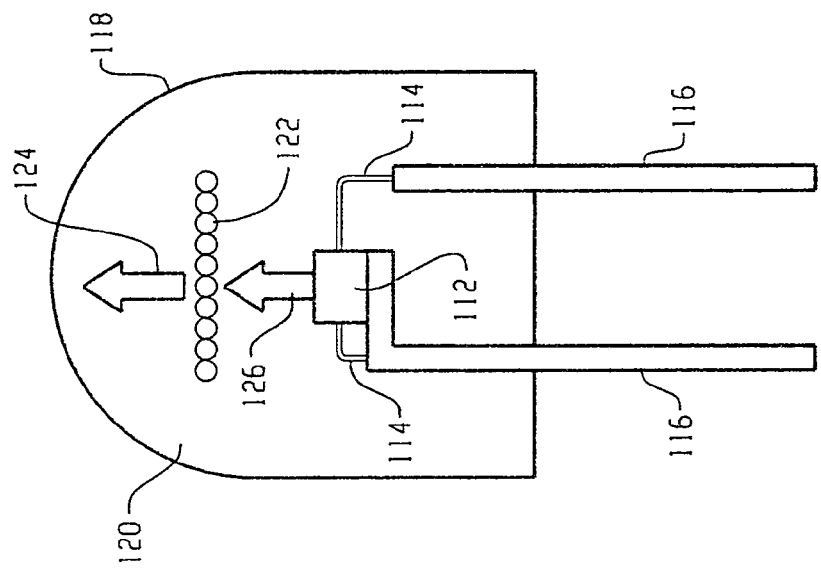
FIG. 2 is a schematic cross-sectional view of an illumination system in accordance with a second embodiment of the present invention.

FIG. 2 illustrates a second preferred structure of the system according to the preferred aspect of the present invention.

Corresponding numbers from FIGS. 1-4 (e.g. 12 in FIGS. 1 and 112 in FIG. 2) relate to corresponding structures in each of the figures unless otherwise stated. The structure of the embodiment of FIG. 2 is similar to that of FIG. 1, except that the phosphor material 122 is interspersed within the encapsulant material 120, instead of being formed directly on the LED chip 112. The phosphor material (in the form of a powder) may be interspersed within a single region of the encapsulant material 120 or, more preferably, throughout the entire volume of the encapsulant material. Radiation 126 emitted by the LED chip 112 mixes with the light emitted by the phosphor material 122, and the mixed light appears as white light 124. If the phosphor is to be interspersed within the encapsulant material 120, then a phosphor powder may be added to a polymer precursor, loaded around the LED chip 112, and then the polymer precursor may be cured to solidify the polymer material. Other known phosphor interspersion methods may also be used, such as transfer molding.

Figure 3:
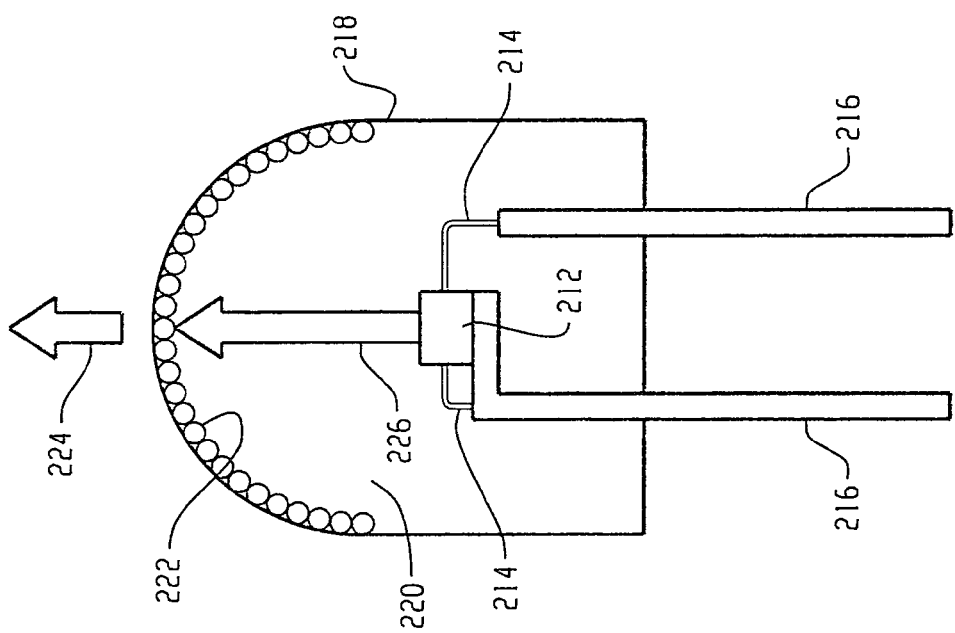
FIG. 3 is a schematic cross-sectional view of an illumination system in accordance with a third embodiment of the present invention.

FIG. 3 illustrates a third preferred structure of the system according to the preferred aspects of the present invention. The structure of the embodiment shown in FIG. 3 is similar to that of FIG. 1, except that the phosphor material 222 is coated onto a surface of the shell 218, instead of being formed over the LED chip 212. The phosphor material is preferably coated on the inside surface of the shell 218, although the phosphor may be coated on the outside surface of the shell, if desired. The phosphor material 222 may be coated on the entire surface of the shell or only a top portion of the surface of the shell. The radiation 226 emitted by the LED chip 212 mixes with the light emitted by the phosphor material 222, and the mixed light appears as white light 224. Of course, the structures of FIGS. 1-3 may be combined and the phosphor may be located in any two or all three locations or in any other suitable location, such as separately from the shell or integrated into the LED.

In any of the above structures, the lamp 10 may also include a plurality of scattering particles (not shown), which are embedded in the encapsulant material. The scattering particles may comprise, for example, $Al_2O_3$ particles (such as alumina powder) or $TiO_2$ particles. The scattering particles effectively scatter the coherent light emitted from the LED chip, preferably with a negligible amount of absorption.

Figure 4:
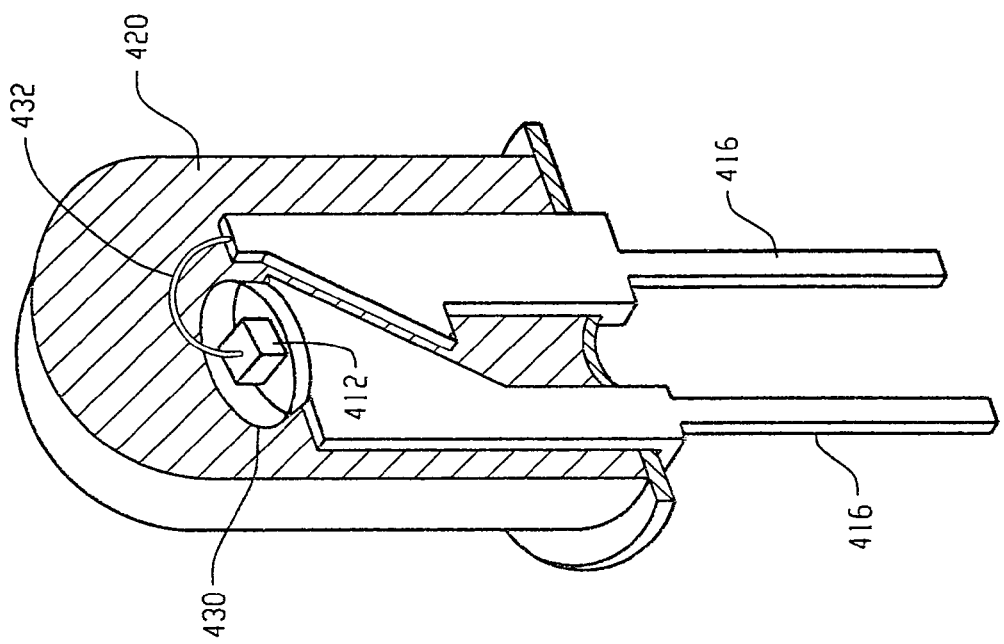
FIG. 4 is a cutaway side perspective view of an illumination system in accordance with a fourth embodiment of the present invention.

As shown in a fourth preferred structure in FIG. 4, the LED chip 412 may be mounted in a reflective cup 430. The cup 430 may be made from or coated with a reflective material, such as alumina, titania, or other dielectric powder known in the art. A preferred reflective material is $Al_2O_3$. The remainder of the structure of the embodiment of FIG. 4 is the same as that of any of the previous Figures, and includes two leads 416, a conducting wire 432 electrically connecting the LED chip 412 with the second lead, and an encapsulant material 420.

In one embodiment, the invention provides a novel phosphor composition, which may be used in the phosphor composition 22 in the above described LED light, having the general formula $L_lM_mA_aG_gP_pQ_qN_nZ_z:Ce^{3+}$, where L is at least one of Li, Na, K, Rb, and/or Cs; M is at least one of Be, Mg, Ca, Sr, Ba, Mn, Sn, Pb, and/or Zn; A is at least one of Bi, Sb, In, Sc, Y, and/or any of the rare earth elements; G is Si and/or Ge; Q is at least one of O, S, and/or Se; Z is at least one of F, Cl, Br, and/or I; and wherein $0 \leq l \leq 1$, $2.5 \leq m \leq 5$, $1.5 \leq a \leq 2.5$, $2 \leq g \leq 2.5$, $0 \leq p \leq 1$, $0 \leq n \leq 1$, $0 \leq z \leq 1$, and $l+2m+3a+4g+5p=2q+3n+z$. The amount of $Ce^{3+}$ doping is from 0.0001 to 10 mole percent.

It should be noted that various phosphors are described herein in which different elements enclosed in parentheses and separated by commas, such as in the case of (Ca,Sr)S: $Eu^{2+}$. As understood by those skilled in the art, this type of notation means that the phosphor can include any or all of those specified elements in the formulation in any ratio. That is, this type of notation for the above phosphor, for example, has the same meaning as $(Ca_{1-e}Sr_e)S:Eu^{2+}$, wherein $0 \leq e \leq 1$.

When used with an LED emitting at from 200 to 500 nm, the resulting lighting system may produce a light having a green color, the characteristics of which will be discussed in more detail below. When used in a phosphor blend with one or more additional phosphors, a white light emitting device for general illumination may be produced.

The above described formulation produces a phosphor with an emission having a deeper red component with no loss in quantum efficiency as compared to the applicant's $(RE)_2(Ca,Mg,Sr,Ba,Zn)_2Si_{3-b}O_{12+\chi}:Ce$ phosphor by shifting the $Ce^{3+}$ emission to a deeper red (i.e. longer) wavelength with the addition of isovalent ions.

An exemplary phosphor in the present embodiment is $(Lu,Sc,Y,Tb)_{2-d-e}Ce_eCa_{1+d}Mg_2Si_3O_{12-d/2}$ where $-0.5 \leq d \leq 1$ and $0 < e \leq 0.1$.

When combined with a LED emitting at from 250-550 nm and, one or more additional phosphors, the use of the above phosphor allows for a white LED device having a higher CRI value and lower CCT as compared to a devices utilizing other red phosphors. LED devices having CCT values from about 2500 to about 10000, preferably from 2500 to 4500, and high CRI values from about 70 to 95 can be made. This allows for an increased x coordinate and a reduced y coordinate on the CIE color chromaticity diagram for the LED device, resulting in a "warmer" color LED.

The above described phosphors may contain optically inert trace impurities including, for example, apatites such as $Ln_{9.33}(SiO_4)_6O_2$, and well as other silicates, such as $Ln_2Si_2O_7$ or $Ln_2SiO_5$. The presence of such impurities in an amount up to 10% by weight of the phosphor composition will not significantly affect the quantum efficiency or color of the phosphor.

The above described phosphor compositions may be produced using known solid state reaction processes for the production of phosphors by combining, for example, elemental oxides, carbonates and/or hydroxides as starting materials. Other starting materials may include nitrates, sulfates, acetates, citrates, or oxalates. Alternately, coprecipitates of the rare earth oxides could be used as the starting materials for the RE elements. Si is typically provided via silicic acid, but other sources such as fumed silica may also be used. In a typical process, the starting materials are combined via a dry or wet blending process and fired in air or under a reducing atmosphere at from, e.g., 1000 to 1600° C.

A fluxing agent may be added to the mixture before or during the step of mixing. This fluxing agent may be $NH_4Cl$ or any other conventional fluxing agent. A quantity of a fluxing agent of less than about 20, preferably less than about 5, percent by weight of the total weight of the mixture is adequate for fluxing purposes. When using fluxes, some of their ions can be incorporated into the phosphor material and become part of its formula.

The starting materials may be mixed together by any mechanical method including, but not limited to, stirring or blending in a high-speed blender or a ribbon blender. The starting materials may be combined and pulverized together in a bowl mill, a hammer mill, or a jet mill. The mixing may be carried out by wet milling especially when the mixture of the starting materials is to be made into a solution for subsequent precipitation. If the mixture is wet, it may be dried first before being fired under a reducing atmosphere at a temperature from about 900° C. to about 1700° C., preferably from about 1000° C. to about 1600° C., for a time sufficient to convert all of the mixture to the final composition.

The firing may be conducted in a batchwise or continuous process, preferably with a stirring or mixing action to promote good gas-solid contact. The firing time depends on the quantity of the mixture to be fired, the rate of gas conducted through the firing equipment, and the quality of the gas-solid contact in the firing equipment. The reducing atmosphere typically comprises a reducing gas such as hydrogen, carbon monoxide, ammonia or a combination thereof, optionally diluted with an inert gas, such as nitrogen, argon, etc., or a combination thereof. Alternatively, the crucible containing the mixture may be packed in a second closed crucible containing high-purity carbon particles and fired in air so that the carbon particles react with the oxygen present in air, thereby, generating carbon monoxide for providing a reducing atmosphere.

These compounds may be blended and dissolved in a nitric acid solution. The strength of the acid solution is chosen to rapidly dissolve the oxygen-containing compounds and the choice is within the skill of a person skilled in the art. Ammonium hydroxide is then added in increments to the acidic solution. An organic base such as methylamine, ethylamine, dimethylamine, trimethylamine, or the like may be used in place of ammonium hydroxide.

The precipitate is filtered, washed with deionized water, and dried. The dried precipitate is ball milled or otherwise thoroughly blended and then calcined in air at about 400° C. to about 1600° C. for a sufficient time to ensure a substantially complete dehydration of the starting material. The calcination may be carried out at a constant temperature. Alternatively, the calcination temperature may be ramped from ambient to and held at the final temperature for the duration of the calcination. The calcined material is similarly fired at 1000-1600° C. for a sufficient time under a reducing atmosphere such as $H_2$, CO, or a mixture of one of theses gases with an inert gas, or an atmosphere generated by a reaction between a coconut charcoal and the products of the decomposition of the starting materials to covert all of the calcined material to the desired phosphor composition.

Alternately, a sol-gel synthesis may also be used to produce the phosphors of the present embodiments. Thus, in an exemplary process, an $Lu_{2-d-e}Ca_{1+d}Ce_eMg_2Si_3O_{12-d/2}$ phosphor according to the present invention can be made by first combining predetermined amounts of $Lu_2O_3$, $CaCO_3$, $MgCO_3$, $Ce_2(CO_3)_3 \cdot wH_2O$ and wetting them with water. Dilute nitric acid is then added to dissolve the oxide and carbonates. The solution is then dried to remove excess nitric acid and then dissolved in absolute ethanol. In a second container, a predetermined amount of tetraethyl orthosilicate (TEOS) is dissolved in absolute, ethanol. The contents of the two containers are then combined and stirred under heat until gelling occurs. The gel is subsequently heated in an oven to remove organics, ground to a powder, and then calcined at 800-1200° C. Finally, the powder may be ground again and further calcined in 1% $H_2$ reducing atmosphere at 1400° C. for 5 hours. Similar procedures can be used for the other described phosphors.

The resulting phosphor particles may preferably have median diameters ($d_{50}$) ranging from 2-30 μm, as determined by light scattering analysis (Horiba LA-920).

While suitable for use alone with a blue or UV LED chip, the above phosphor compositions may be blended with one or more additional phosphors for use in white LED light sources. Thus, in another embodiment, an LED lighting assembly is provided including a phosphor composition comprising a blend of the above phosphor with one or more additional phosphors.

Thus, in another embodiment, there is provided a white light emitting device including a UV emitting LED chip emitting at from about 200 to about 500 nm and a phosphor blend including the above described $L_lM_mA_aG_gP_pQ_qN_nZ_z$:$Ce^{3+}$ phosphor, and one or more additional phosphors, preferably at least a blue and a green phosphor. The relative amounts of each phosphor in the phosphor blend can be described in terms of spectral weight. The spectral weight is the relative amount that each phosphor contributes to the overall emission spectra of the phosphor blend. The spectral weight amounts of all the individual phosphors should add up to 1. In a preferred embodiment, each of the phosphors in the blend will have a spectral weight ranging from about 0.01 to 0.8.

Depending on the identity of the specific blue and red phosphors, exemplary lighting apparatuses may be produced having CRI ($R_a$) values greater than 90 and CCT values <4500 K.

In addition, other phosphors such as green, yellow, orange, or other color phosphors may be used in the blend to customize the white color of the resulting light and produce sources with improved light quality. While not intended to be limiting, suitable phosphors for use in the blend with the present phosphors include:

$(Ba,Sr,Ca)_5(PO_4)_3(Cl,F,Br,OH):Eu^{2+},Mn^{2+}$
$(Ba,Sr,Ca)BPO_5:Eu^{2+},Mn^{2+}$
$(Sr,Ca)_{10}(PO_4)_6 \cdot vB_2O_3:Eu^{2+}$ (wherein $0<v\leq!$
$Sr_2Si_3O_8 \cdot 2SrCl_2:Eu^{2+}$
$(Ca,Sr,Ba)_3MgSi_2O_8:Eu^{2+},Mn^{2+}$
$BaAl_8O_{13}:Eu^{2+}$
$2SrO \cdot 0.84P_2O_5 \cdot 0.16B_2O_3:Eu^{2+}$;
$(Ba,Sr,Ca)MgAl_{10}O_{17}:Eu^{2+},Mn^{2+}$
$(Ba,Sr,Ca)Al_2O_4:Eu^{2+}$
$(Y,Gd,Lu,Sc,La)BO_3:Ce^{3+},Tb^{3+}$
$(Ba,Sr,Ca)_2Si_{1-\xi}O_{4-2\xi}:Eu^{2+}$ (wherein $0\leq\xi\leq0.2$)
$(Ba,Sr,Ca)_2(Mg,Zn)Si_2O_7:Eu^{2+}$
$(Sr,Ca,Ba)(Al,Ga,In)_2S_4:Eu^{2+}$
$(Y,Gd,Tb,La,Sm,Pr,Lu)_3(Al,Ga)_{5-\alpha}O_{12-3/2\alpha}:Ce^{3+}$ (wherein $0\leq\alpha\leq0.5$)
$(Ca,Sr)_8(Mg,Zn)(SiO_4)_4Cl_2:Eu^{2+},Mn^{2+}$
$Na_2Gd_2B_2O_7:Ce^{3+},Tb^{3+}$
$(Sr,Ca,Ba,Mg,Zn)_2P_2O_7:Eu^{2+},Mn^{2+}$
$(Gd,Y,Lu,La)_2O_3:Eu^{3+},Bi^{3+}$
$(Gd,Y,Lu,La)_2O_2S:Eu^{3+},Bi^{3+}$
$(Gd,Y,Lu,La)VO_4:Eu^{3+},Bi^{3+}$
$(Ca,Sr)S:Eu^{2+},Ce^{3+}$
$SrY_2S_4:Eu^{2+}$
$CaLa_2S_4:Ce^{3+}$
$(Ba,Sr,Ca)MgP_2O_7:Eu^{2+},Mn^{2+}$
$(Y,Lu)_2WO_6:Eu^{3+},Mo^{6+}$
$(Ba,Sr,Ca)_\beta Si_\gamma N_\mu:Eu^{2+}$ (wherein $2\beta+4\gamma=3\mu$)
$Ca_3(SiO_4)Cl_2:Eu^{2+}$
$(Y,Lu,Gd)_{2-\phi}Ca_\phi Si_4N_{6+\phi}C_{1-\phi}:Ce^{3+}$, (wherein $0\leq\phi\leq0.5$)
$(Lu,Ca,Li,Mg,Y)$alpha-SiAlON doped with $Eu^{2+}$ and/or $Ce^{3+}$
$3.5MgO \cdot 0.5MgF_2 \cdot GeO_2:Mn^{4+}$
$Ca_{1-c-f}Ce_cEu_fAl_{1+c}Si_{1-c}N_3$, (where $0<c\leq0.2$, $0\leq f\leq0.2$)
$Ca_{1-h-r}Ce_hEu_rAl_{1-h}(Mg,Zn)_hSiN_3$, (where $0<h\leq0.2$, $0\leq r\leq0.2$)
$Ca_{1-2s-t}Ce_s(Li,Na)_sEu_tAlSiN_3$, (where $0\leq s\leq0.2$, $0\leq f\leq0.2$, $s+t>0$)
$Ca_{1-o-\chi-\phi}Ce_o(Li,Na)_\chi Eu_\phi Al_{1+o-\chi}N_3$, (where $0\leq\sigma\leq0.2$, $0<\chi\leq0.4$, $0\leq\phi\leq0.2$)

For purposes of the present application, it should be understood that when a phosphor has two or more dopant ions (i.e. those ions following the colon in the above compositions), this is meant to mean that the phosphor has at least one (but not necessarily all) of those dopant ions within the material. That is, as understood by those skilled in the art, this type of notation means that the phosphor can include any or all of those specified ions as dopants in the formulation.

When the phosphor composition includes a blend of two or more phosphors, the ratio of each of the individual phosphors in the phosphor blend may vary depending on the characteristics of the desired light output. The relative proportions of the individual phosphors in the various embodiment phosphor blends may be adjusted such that when their emissions are blended and employed in an lighting device, there is produced visible light of predetermined x and y values on the CIE chromaticity diagram. As stated, a white light is preferably produced. This white light may, for instance, may possess an x value in the range of about 0.30 to about 0.55, and a y value in the range of about 0.30 to about 0.55. As stated, however, the exact identity and amounts of each phosphor in the phosphor composition can be varied according to the needs of the end user.

It may be desirable to add pigments or filters to the phosphor composition. When the LED is a UV emitting LED, the phosphor layer 22 may also comprise from 0 up to about 10% by weight (based on the total weight of the phosphors) of a pigment or other UV absorbent material capable of absorbing or reflecting UV radiation having a wavelength between 200 nm and 450 nm.

Suitable pigments or filters include any of those known in the art that are capable of absorbing radiation generated between 200 nm and 450 nm. Such pigments include, for example, nickel titanate or praseodymium zirconate. The pigment may be used in an amount effective to filter 10% to 100% of the radiation generated in the 200 nm to 500 nm range.

EXAMPLES

Sample phosphors were made by mixing the following starting materials following the nominal compositions given below. The mass of silicic acid is corrected for the loss of $H_2O$ upon ignition at higher temperatures. All samples were mixed using fused $ZrO_2$ media in Nalgene bottles and fired in covered alumina crucibles at 1400° C. for 5 hrs, all under 1% $H_2/N_2$ atmosphere. Various phosphors according to the above embodiment were synthesized, milled in water to an average size of 12 μm and pressed into plaques. The quantum efficiency (QE) compared to commercial YAG:Ce phosphors was measured, along with the absorbance (Abs) and CIE x, y color coordinates. The results are listed below in Table 1.

Sample 1: $Lu_{2.08}Ce_{0.12}Ca_{0.8}Mg_2Si_3O_{12.2}$
$Lu_2O_3$: 2.805 g
$CeO_2$: 0.140 g
$CaCO_3$: 0.543 g
MgO: 0.546 g
Silicic acid: 1.521 g Sample 2: $Lu_{1.98}Ce_{0.12}Ca_{0.9}Mg_2Si_3O_{12.1}$
$Lu_2O_3$: 2.720 g
$CeO_2$: 0.143 g
$CaCO_3$: 0.622 g
MgO: 0.557 g
Silicic acid: 1.549 g Sample 3: $Lu_{1.88}Ce_{0.12}CaMg_2Si_3O_{12}$
$Lu_2O_3$: 5.263 g
$CeO_2$: 0.291 g
$CaCO_3$: 1.408 g
MgO: 1.134 g
Silicic acid: 3.157 g Sample 4: $Lu_{1.78}Ce_{0.12}Ca_{1.1}Mg_2Si_3O_{11.9}$
$Lu_2O_3$: 5.092 g
$CeO_2$: 0.297 g
$CaCO_3$: 1.583 g
MgO: 1.159 g
Silicic acid: 3.226 g Sample 5: $Lu_{1.68}Ce_{0.12}Ca_{1.2}Mg_2Si_3O_{11.8}$
$Lu_2O_3$: 4.912 g
$CeO_2$: 0.304 g
$CaCO_3$: 1.765 g
MgO: 1.184 g
Silicic acid: 3.297 g Sample 6: $Lu_{1.58}Ce_{0.12}Ca_{1.3}Mg_2Si_3O_{11.7}$
$Lu_2O_3$: 4.724 g
$CeO_2$: 0.310 g
$CaCO_3$: 1.955 g
MgO: 1.211 g
Silicic acid: 3.372 g

TABLE 1

| Phosphor | QE (as % of YAG) | Abs (470 nm) | x | y |
| --- | --- | --- | --- | --- |
| $Lu_{2.08}Ce_{0.12}Ca_{0.8}Mg_2Si_3O_{12.2}$ | 83 | 64 | 0.521 | 0.473 |
| $Lu_{1.98}Ce_{0.12}Ca_{0.9}Mg_2Si_3O_{12.1}$ | 82 | 60 | 0.526 | 0.468 |
| $Lu_{1.88}Ce_{0.12}CaMg_2Si_3O_{12}$ | 91 | 71 | 0.535 | 0.460 |
| $Lu_{1.78}Ce_{0.12}Ca_{1.1}Mg_2Si_3O_{11.9}$ | 90 | 69 | 0.537 | 0.458 |
| $Lu_{1.68}Ce_{0.12}Ca_{1.2}Mg_2Si_3O_{11.8}$ | 88 | 69 | 0.538 | 0.457 |
| $Lu_{1.58}Ce_{0.12}Ca_{1.3}Mg_2Si_3O_{11.7}$ | 89 | 68 | 0.541 | 0.455 |

The phosphor composition described above may be used in additional applications besides LEDs. For example, the material may be used as a phosphor in a fluorescent lamp, in a cathode ray tube, in a plasma display device or in a liquid crystal display (LCD). The material may also be used as a scintillator in an electromagnetic calorimeter, in a gamma ray camera, in a computed tomography scanner or in a laser. In an embodiment, the invention provides a lighting apparatus for emitting light comprising a light source emitting radiation having a peak emission from about 200 nm to about 500 nm, and a phosphor material radiationally coupled to the light source, the phosphor material comprising $L_lM_mA_aG_gP_pQ_q N_nZ_z:Ce^{3+}$, where L is at least one of Li, Na, K, Rb, and/or Cs; M is at least one of Be, Mg, Ca, Sr, Ba, Mn, Sn, Pb, and/or Zn; A is at least one of Bi, Sb, In, Sc, Y, and/or any of the rare earth elements; G is Si and/or Ge; Q is at least one of O, S, and/or Se; X is at least one of F, Cl, Br, and/or I; and wherein $0 \leq l \leq 1$, $2.5 \leq m \leq 5$, $1.5 \leq a \leq 2.5$, $0 \leq p \leq 1$, $0 \leq n \leq 1$, $0 \leq z \leq 1$, and $l+2m+3a+4g+5p=2q+3n+z$, wherein the lighting apparatus comprises a discharge lamp and the phosphor material is coated on a surface of a alass envelope. These uses are meant to be merely exemplary and not exhaustive.

The present development has been described with reference to various exemplary embodiments. Modifications and alteration will occur to others upon a reading and understanding of this specification. The invention is intended to include all such modifications and alterations insofar as they come within the scope of the appended claims or the equivalent thereof.

What is claimed is:

1. A lighting apparatus for emitting light comprising:
   a light source emitting radiation having a peak emission from about 200 nm to about 500 nm; and
   a phosphor material radiationally coupled to the light source, the phosphor material comprising $L_lM_mA_aG_gP_pQ_qN_nZ_z$:Ce$^{3+}$, where L is at least one of Li, Na, K, Rb, and/or Cs; M is at least one of Be, Mg, Ca, Sr, Ba, Mn, Sn, Pb, and/or Zn; A is at least one of Bi, Sb, In, Sc, Y, and/or any of the rare earth elements; G is Si and/or Ge; Q is at least one of O, S, and/or Se; Z is at least one of F, Cl, Br, and/or I; and wherein $0 \leq l \leq 1$, $2.5 \leq m \leq 5$, $1.5 \leq a \leq 2.5$, $2 \leq g \leq 2.5$, $0 \leq p \leq 1$, $0 \leq n \leq 1$, $0 \leq z \leq 1$, and $l+2m+3a+4g+5p=2q+3n+z$.

2. The lighting apparatus according to claim 1, wherein the light source is an LED.

3. The lighting apparatus according to claim 2, wherein the LED comprises a nitride compound semiconductor represented by the formula $In_iGa_jAl_kN$, where $0 \leq i$; $0 \leq j$, $0 \leq k$, and $i+j+k=1$.

4. The lighting apparatus according to claim 1, wherein the amount of Ce$^{3+}$ doping is from 0.0001 to 10 mole percent.

5. The lighting apparatus according to claim 1, wherein the light source is an organic emissive structure.

6. The lighting apparatus according to claim 1, wherein the phosphor material is coated on a surface of the light source.

7. The lighting apparatus according to claim 1, further comprising an encapsulant surrounding the light source and the phosphor material.

8. The lighting apparatus according to claim 1, wherein the phosphor material is dispersed in the encapsulant.

9. The lighting apparatus according to claim 1, further comprising a reflector cup.

10. The lighting apparatus according to claim 1, wherein the lighting apparatus comprises a discharge lamp and wherein said phosphor material is coated on a surface of a glass envelope.

11. The lighting apparatus according to claim 1, wherein said phosphor material further comprises one or more additional phosphors.

12. The lighting apparatus according to claim 11, wherein said one or more additional phosphors are selected from the group including:
   (Ba,Sr,Ca)$_5$(PO$_4$)$_3$(Cl,F,Br,OH):Eu$^{2+}$,Mn$^{2+}$; (Ba,Sr,Ca)BPO$_5$:Eu$^{2+}$,Mn$^{2+}$;
   (Sr,Ca)$_{10}$(PO$_4$)$_6$*vB$_2$O$_3$:Eu$^{2+}$ (wherein $0<v\leq1$); Sr$_2$Si$_3$O$_8$*2SrCl$_2$:Eu$^{2+}$;
   (Ca,Sr,Ba)$_3$MgSi$_2$O$_8$:Eu$^{2+}$,Mn$^{2+}$; BaAl$_8$O$_{13}$:Eu$^{2+}$; 2SrO*0.84P$_2$O$_5$*0.16B$_2$O$_3$:Eu$^{2+}$;
   (Ba,Sr,Ca)MgAl$_{10}$O$_{17}$:Eu$^{2+}$,Mn$^{2+}$; (Ba,Sr,Ca)Al$_2$O$_4$:Eu$^{2+}$;
   (Y,Gd,Lu,Sc,La)BO$_3$:Ce$^{3+}$,Tb$^{3+}$; (Ba,Sr,Ca)$_2$Si$_{1-\xi}$O$_{4-2\xi}$:Eu$^{2+}$ (wherein $0 \leq \xi \leq 0.2$);
   (Ba,Sr,Ca)$_2$(Mg,Zn)Si$_2$O$_7$:Eu$^{2+}$; (Sr,Ca,Ba)(Al,Ga,In)$_2$S$_4$:Eu$^{2+}$;
   (Y,Gd,Tb,La,Sm,Pr,Lu)$_3$(Al,Ga)$_{5-\alpha}$O$_{12-3/2\alpha}$:Ce$^{3+}$ (wherein $0 \leq \alpha \leq 0.5$);
   (Ca,Sr)$_8$(Mg,Zn)(SiO$_4$)$_4$Cl$_2$:Eu$^{2+}$, Mn$^{2+}$; Na$_2$Gd$_2$B$_2$O$_7$:Ce$^{3+}$,Tb$^{3+}$;
   (Sr,Ca,Ba,Mg,Zn)$_2$P$_2$O$_7$:Eu$^{2+}$,Mn$^{2+}$; (Gd,Y,Lu,La)$_2$O$_3$:Eu$^{3+}$,Bi$^{3+}$;
   (Gd,Y,Lu,La)$_2$O$_2$S:Eu$^{3+}$,Bi$^{3+}$; (Gd,Y,Lu,La)VO$_4$:Eu$^{3+}$,Bi$^{3+}$; (Ca,Sr)S:Eu$^{2+}$,Ce$^{3+}$;
   SrY$_2$S$_4$:Eu$^{2+}$; CaLa$_2$S$_4$:Ce$^{3+}$; (Ba,Sr,Ca)MgP$_2$O$_7$:Eu$^{2+}$,Mn$^{2+}$; (Y,Lu)$_2$WO$_6$:Eu$^{3+}$,Mo$^{6+}$;
   (Ba,Sr,Ca)$_\beta$Si$_\gamma$N$_\mu$:Eu$^{2+}$ (wherein $2\beta+4\gamma=3\mu$); Ca$_3$(SiO$_4$)Cl$_2$:Eu$^{2+}$; (Y,Lu,Gd)$_{2-\phi}$Ca$_\phi$Si$_4$N$_{6+\phi}$C$_{1-\phi}$:Ce$^{3+}$, (wherein $0 \leq \phi \leq 0.5$); (Lu,Ca,Li,Mg,Y)alpha-SiAlON doped with Eu$^{2+}$ and/or Ce$^{3+}$; 3.5MgO*0.5MgF$_2$*GeO$_2$:Mn$^{4+}$; Ca$_{1-c-f}$Ce$_c$Eu$_f$Al$_{1+c}$Si$_{1-c}$N$_3$, (where $0 \leq c \leq 0.2$, $0 \leq f \leq 0.2$); Ca$_{1-h-r}$Ce$_h$Eu$_r$Al$_{1-h}$(Mg,Zn)$_h$SiN$_3$, (where $0<h \leq 0.2$, $0 \leq r \leq 0.2$); Ca$_{1-2s-t}$Ce$_s$(Li,Na)$_s$Eu$_t$AlSiN$_3$, (where $0 \leq s \leq 0.2$, $0 \leq f \leq 0.2$, $s+t>0$); and Ca$_{1-o-\chi-f}$Ce$_o$(Li,Na)$_\chi$Eu$_\phi$Al$_{1+o-\chi}$Si$_{1-o+\chi}$N$_3$, (where $0 \leq \sigma \leq 0.2$, $0 \leq \chi \leq 0.4$, $0 \leq \phi \leq 0.2$).

13. The lighting apparatus according to claim 11, wherein said phosphor material is capable of absorbing the radiation emitted by a light source having a peak emission from 200-500 nm and emitting radiation that, when combined with said radiation from said light source, produces white light.

14. The lighting apparatus according to claim 13, wherein said apparatus has a color temperature of <4500 K.

15. The lighting apparatus according to claim 13, wherein said apparatus has a general CRI ($R_a$) of 90 or greater.

16. The lighting apparatus of claim 1, wherein said phosphor material comprises (Lu,Sc,Y,Tb)$_{2-d-e}$Ce$_e$Ca$_{1+d}$Mg$_2$Si$_3$O$_{12-d/2}$ where $-0.5 \leq d \leq 1$ and $0<e \leq 0.1$.

17. A phosphor blend comprising a first phosphor composition comprising $L_lM_mA_aG_gP_pQ_qN_nZ_z$:Ce$^{3+}$, where L is at least one of Li, Na, K, Rb, and/or Cs; M is at least one of Be, Mg, Ca, Sr, Ba, Mn, Sn, Pb, and/or Zn; A is at least one of Bi, Sb, In, Sc, Y, and/or any of the rare earth elements; G is Si and/or Ge; Q is at least one of O, S, and/or Se; Z is at least one of F, Cl, Br, and/or I; and wherein $0 \leq l \leq 1$, $2.5 \leq m \leq 5$, $1.5 \leq a \leq 2.5$, $2 \leq g \leq 2.5$, $0 \leq p \leq 1$, $0 \leq n \leq 1$, $0 \leq z \leq 1$, and $l+2m+3a+4g+5p=2q+3n+z$; and at least one additional phosphor composition.

18. The phosphor blend according to claim 17, wherein said phosphor blend comprises one or more of the group including:
   (Ba,Sr,Ca)$_5$(PO$_4$)$_3$(Cl,F,Br,OH):Eu$^{2+}$,Mn$^{2+}$; (Ba,Sr,Ca)BPO$_5$:Eu$^{2+}$,Mn$^{2+}$;
   (Sr,Ca)$_{10}$(PO$_4$)$_6$*vB$_2$O$_3$:Eu$^{2+}$ (wherein $0<v \leq 1$); Sr$_2$Si$_3$O$_8$*2SrCl$_2$:Eu$^{2+}$;
   (Ca,Sr,Ba)$_3$MgSi$_2$O$_8$:Eu$^{2+}$,Mn$^{2+}$; BaAl$_8$O$_{13}$:Eu$^{2+}$; 2SrO*0.84P$_2$O$_5$*0.16B$_2$O$_3$:Eu$^{2+}$;
   (Ba,Sr,Ca)MgAl$_{10}$O$_{17}$:Eu$^{2+}$,Mn$^{2+}$; (Ba,Sr,Ca)Al$_2$O$_4$:Eu$^{2+}$;
   (Y,Gd,Lu,Sc,La)BO$_3$:Ce$^{3+}$,Tb$^{3+}$; (Ba,Sr,Ca)$_2$Si$_{1-\xi}$O$_{4-2\xi}$:Eu$^{2+}$ (wherein $0 \leq \xi \leq 0.2$);
   (Ba,Sr,Ca)$_2$(Mg,Zn)Si$_2$O$_7$:Eu$^{2+}$; (Sr,Ca,Ba)(Al,Ga,In)$_2$S$_4$:Eu$^{2+}$;
   (Y,Gd,Tb,La,Sm,Pr,Lu)$_3$(Al,Ga)$_{5-\alpha}$O$_{12-3/2\alpha}$:Ce$^{3+}$ (wherein $0 \leq \alpha \leq 0.5$);
   (Ca,Sr)$_8$(Mg,Zn)(SiO$_4$)$_4$Cl$_2$:Eu$^{2+}$,Mn$^{2+}$; Na$_2$Gd$_2$B$_2$O$_7$:Ce$^{3+}$,Tb$^{3+}$;
   (Sr,Ca,Ba,Mg,Zn)$_2$P$_2$O$_7$:Eu$^{2+}$,Mn$^{2+}$; (Gd,Y,Lu,La)$_2$O$_3$:Eu$^{3+}$,Bi$^{3+}$;
   (Gd,Y,Lu,La)$_2$O$_2$S:Eu$^{3+}$,Bi$^{3+}$; (Gd,Y,Lu,La)VO$_4$:Eu$^{3+}$,Bi$^{3+}$; (Ca,Sr)S:Eu$^{2+}$,Ce$^{3+}$;
   SrY$_2$S$_4$:Eu$^{2+}$; CaLa$_2$S$_4$:Ce$^{3+}$; (Ba,Sr,Ca)MgP$_2$O$_7$:Eu$^{2+}$,Mn$^{2+}$; (Y,Lu)$_2$WO$_6$:Eu$^{3+}$,Mo$^{6+}$;
   (Ba,Sr,Ca)$_\beta$Si$_\gamma$N$_\mu$:Eu$^{2+}$ (wherein $2\beta+4\gamma=3\mu$); Ca$_3$(SiO$_4$)Cl$_2$:Eu$^{2+}$; (Y,Lu,Gd)$_{2-\phi}$Ca$_\phi$Si$_4$N$_{6+\phi}$C$_{1-\phi}$:Ce$^{3+}$, (wherein $0 \leq \phi \leq 0.5$); (Lu,Ca,Li,Mg,Y)alpha-Si doped with Eu$^{2+}$ and/or Ce$^{3+}$; 3.5MgO*0.5MgF$_2$*GeO$_2$:Mn$^{4+}$; Ca$_{1-c-f}$Ce$_c$Eu$_f$Al$_{1+c}$Si$_{1-c}$N$_3$, (where $0<c \leq 0.2$, $0 \leq f \leq 0.2$); Ca$_{1-h-r}$Ce$_h$Eu$_r$Al$_{1-h}$(Mg,Zn)$_h$SiN$_3$, (where $0<h \leq 0.2$, $0 \leq r \leq 0.2$); Ca$_{1-2s-t}$Ce$_s$(Li,Na)$_s$Eu$_t$AlSiN$_3$, (where $0 \leq s \leq 0.2$, $0 \leq f \leq 0.2$, $s+t>0$); and Ca$_{1-o-\chi-f}$Ce$_o$(Li,Na)$_\chi$Eu$_\phi$Al$_{1+o-\chi}$Si$_{1-o+\chi}$N$_3$, (where $0 \leq \sigma \leq 0.2$, $0 \leq \chi \leq 0.4$, $0 \leq \phi \leq 0.2$).

19. A phosphor material comprising $L_l M_m A_a G_g P_p Q_q N_n Z_z$:$Ce^{3+}$, where L is at least one of Li, Na, K, Rb, and/or Cs; M is at least one of Be, Mg, Ca, Sr, Ba, Mn, Sn, Pb, and/or Zn; A is at least one of Bi, Sb, In, Y, and/or any of the rare earth elements; G is Si and/or Ge; Q is at least one of O, S, and/or Se; Z is at least one of F, Cl, Br, and/or I; and wherein $0 \leq l \leq 1$, $2.5 \leq m \leq 5$, $1.5 \leq a \leq 2.5$, $2 \leq g \leq 2.5$, $0 \leq p \leq 1$, $0 \leq n \leq 1$, $0 \leq z \leq 1$, and $l+2m+3a+4g+5p=2q+3n+z$ and the amount of $Ce^{3+}$ doping is from 0.0001 to 10 mole percent.

20. The phosphor material of claim 19, wherein said phosphor material comprises $(Lu,Sc,Y,Tb)_{2-d-e} Ce_e Ca_{1+d} Mg_2 Si_3 O_{12-e/2}$ where $-0.5 \leq d \leq 1$ and $0 < e \leq 0.1$.

21. A phosphor material comprising $L_l M_m A_a G_g P_p Q_q N_n Z_z Ce^{3+}$, where L is at least one of Li, Na, K, Rb, and/or Cs; M is at least one of Be, Mg, Ca, Sr, Ba, Mn, Sn, Pb, and/or Zn; A is at least one of Bi, Sb, In, Sc, Y, and/or any of the rare earth elements; G is Si; Q is at least one of O, S, and/or Se; Z is at least one of F, Cl, Br, and/or I; and wherein $0 \leq l \leq 1$, $2.5 \leq m \leq 5$, $1.5 \leq a \leq 2.5$, $2 \leq g \leq 2.5$, $0 \leq p \leq 1$, $0 \leq n \leq 1$, $0 \leq z \leq 1$, and $l+2m+3a+4g+5p=2q+3n+z$ and the amount of $Ce^{3+}$ doping is from 0.0001 to 10 mole percent.

22. A phosphor material comprising $L_l M_m A_a G_g P_p Q_q N_n Z_z Ce^{3+}$, where L is at least one of Li, Na, K, Rb, and/or Cs; M is at least one of Be, Mg, Ca, Sr, Ba, Mn, Sn, Pb, and/or Zn; A is at least one of Bi, Sb, In, Y, and/or any of the rare earth elements; G is Si; Q is at least one of O, S, and/or Se; Z is at least one of F, Cl, Br, and/or I; and wherein $0 \leq l \leq 1$, $2.5 \leq m \leq 5$, $1.5 \leq a \leq 2.5$, $2 \leq g \leq 2.5$, $0 \leq p \leq 1$, $0 \leq n \leq 1$, $0 \leq z \leq 1$, and $l+2m+3a+4g+5p=2q+3n+z$ and the amount of $Ce^{3+}$ doping is from 0.0001 to 10 mole percent.

* * * * *